(12) United States Patent
Matsubara et al.

(10) Patent No.: US 6,555,911 B1
(45) Date of Patent: Apr. 29, 2003

(54) SEMICONDUCTOR DEVICE AND METHOD OF MANUFACTURING INTERCONNECTIONS THEREOF USING COPPER AND TUNGSTEN IN PREDETERMINED RATIOS

(75) Inventors: Yoshihisa Matsubara, Tokyo (JP); Toshiyuki Takewaki, Tokyo (JP); Manabu Iguchi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/716,464

(22) Filed: Nov. 21, 2000

(30) Foreign Application Priority Data

Nov. 25, 1999 (JP) ............................................. 11-334658

(51) Int. Cl.[7] ............................................. H01L 23/53
(52) U.S. Cl. ........................ 257/758; 257/775; 257/763
(58) Field of Search ................................. 257/758, 775, 257/762, 774, 763

(56) References Cited

U.S. PATENT DOCUMENTS 6,078,088 A * 6/2000 Buynoshi ..................... 257/410

FOREIGN PATENT DOCUMENTS

| JP | 8-37289 | 2/1996 |
| JP | 11-330246 | 11/1999 |
| JP | 2000-216264 | 8/2000 |

\* cited by examiner

Primary Examiner—Nathan J. Flynn
Assistant Examiner—Leonardo Andújar
(74) Attorney, Agent, or Firm—Young & Thompson (57) ABSTRACT

A semiconductor device having a plurality of interconnection layers includes signal lines formed of copper according to a single damascene process, vias formed of tungsten beneath the signal lines according to a single damascene process, and power and ground lines and vias therebeneath formed of copper according to a dual damascene process. Since copper has a better heat radiating capability than tungsten, the vias in all the layers have a better heat radiating capability than those formed of tungsten.

7 Claims, 10 Drawing Sheets

SEMICONDUCTOR DEVICE AND METHOD OF MANUFACTURING INTERCONNECTIONS THEREOF USING COPPER AND TUNGSTEN IN PREDETERMINED RATIOS

BACKGROUND OF THE INVENTION

1. Field of the Invention

The present invention relates to a semiconductor device and a method of manufacturing interconnections thereof, and more particularly to a semiconductor device having a damascene structure and a method of manufacturing interconnections thereof.

2. Description of the Related Art

The damascene technology used in processes of fabricating semiconductor devices is capable of easily planarizing interlayer insulation films and forming interconnections, and is applicable to the formation of interconnections made of conductive materials such as copper (Cu), etc. which are difficult to etch according to reactive ion etching (RIE).

Damascene structures include a single damascene structure and a dual damascene structure. The single damascene structure is produced by embedding a conductive layer in a via hole and an interconnection groove by film deposition, and then polishing off an excessive deposit of the conductive layer to produce a via hole filling and an interconnection separately. The dual damascene structure is produced by forming a groove in a region where a via hole and an interconnection will be produced, embedding a conductive layer in the groove by film deposition, and then polishing off an excessive deposit of the conductive layer to produce a via hole filling and an interconnection simultaneously.

A process of fabricating a semiconductor device according to the single damascene technology will be described below with reference to FIGS. 1a through 1j of the accompanying drawings.

Figure 1A:
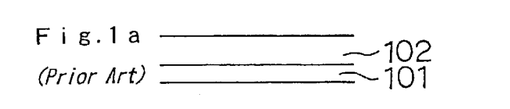
FIGS. 1a to 1j are fragmentary cross-sectional views illustrative of a process of fabricating a semiconductor device according to the single damascene technology.
Figure 1B:
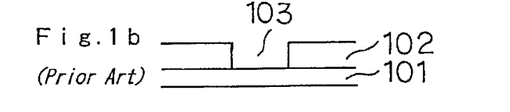

First, as shown in FIG. 1a, oxide film 102 is deposited on silicon substrate 101 with circuit components formed therein. INTERCONNECTIONS THEREOF Then, as shown in FIG. 1b, groove 103 is formed by etching in a portion of oxide film 102 where a contact will be produced.

Figure 1C:
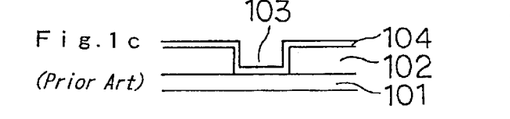

As shown in FIG. 1c, barrier layer 104 is deposited on the entire surface of oxide film 102 including groove 103.

Figure 1D:
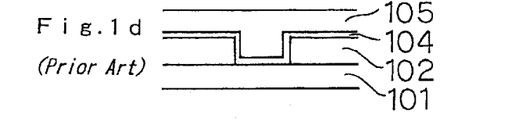

As shown in FIG. 1d, conductive layer 105 of tungsten is deposited on barrier layer 104, thereby embedding tungsten in groove 103.

Figure 1E:
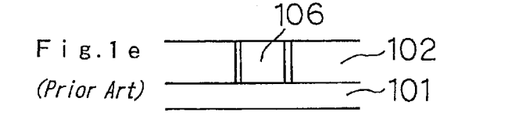

Thereafter, the entire assembly is polished by CMP (Chemical Mechanical Polishing) to remove conductive layer 105 and barrier layer 104 except groove 103, thus producing contact 106 in groove 103, as shown in FIG. 1e.

Figure 1F:
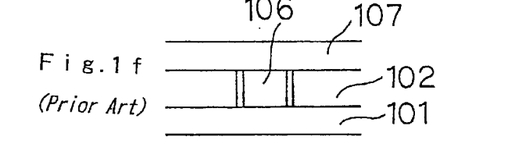

Then, as shown in FIG. 1f, oxide film 107 is deposited on oxide film 102 with contact 106 provided therein.

Figure 1G:
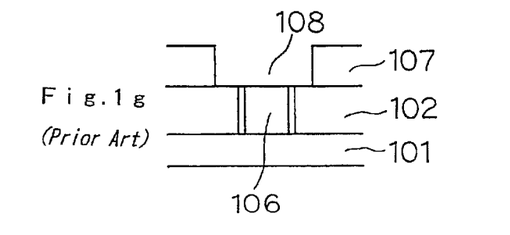

As shown in FIG. 1g, groove 108 is formed by etching in oxide film 107 over contact 106.

Figure 1H:
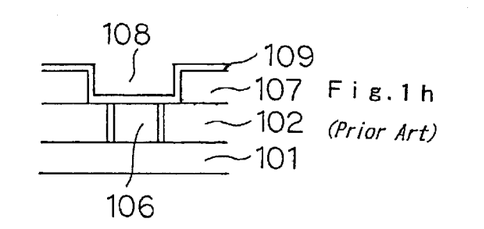

As shown in FIG. 1h, barrier layer 109 is deposited on the entire; surface of oxide film 107 including groove 108.

Figure 1I:
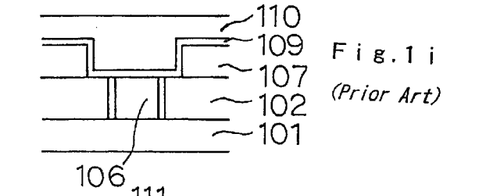

Then, as shown in FIG. 1i, conductive layer 110 of copper is deposited on barrier layer 109, thereby embedding copper in groove 108.

Figure 1J:
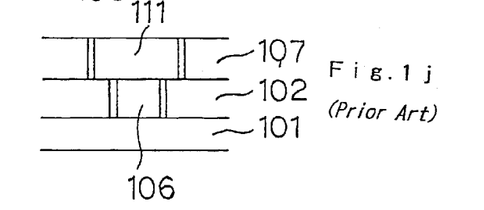

Thereafter, the entire assembly is polished by CMP to remove conductive layer 110 and barrier layer 109 except groove 108, thus producing interconnection 111 in groove 108, as shown in FIG. 1j.

The above successive steps of the process produce a semiconductor device having a single damascene structure. If a semiconductor device comprising a plurality of layers is to be fabricated according to the single damascene technology, then the above process is repeated to produce a semiconductor device of single damascene structure which comprises a plurality of layers.

A process of fabricating a semiconductor device according to the dual damascene technology will be described below with reference to FIGS. 2a through 2f of the accompanying drawings.

Figure 2A:
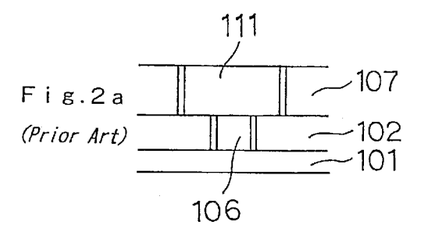
FIGS. 2a to 2f are fragmentary cross-sectional views illustrative of a process of fabricating a semiconductor device according to the dual damascene technology.

First, as shown in FIG. 2a, contact 106 and interconnection 111 are formed according to the single damascene technology as shown in FIGS. 1a through 1j.

Figure 2B:
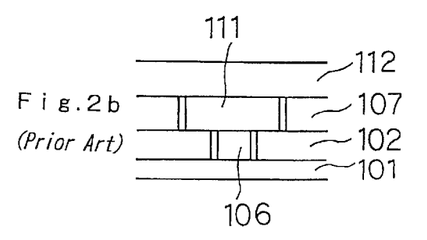

Then, as shown in FIG. 2b, oxide film 112 is deposited on oxide film 107 with interconnection 111 formed therein.

Figure 2C:
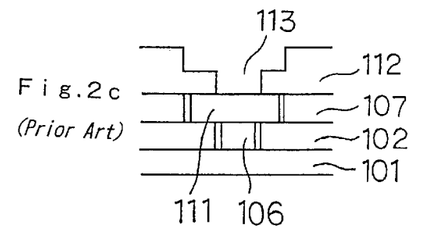

Then, as shown in FIG. 2c, groove 113 is formed by etching in a portion of oxide film 112 where a via and an interconnection will be produced.

Figure 2D:
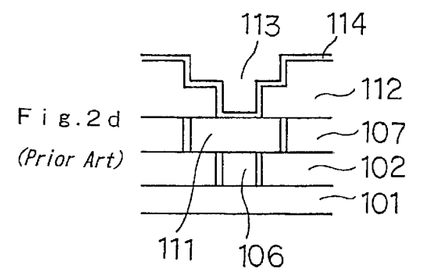

As shown in FIG. 2d, barrier layer 114 is deposited on the entire surface of oxide film 112 including groove 113.

Figure 2E:
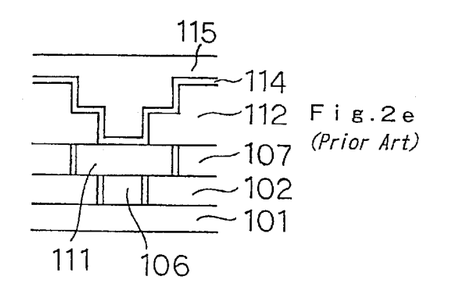

As shown in FIG. 2e, conductive layer 115 of copper is deposited on barrier layer 114, thereby embedding copper in groove 113.

Figure 2F:
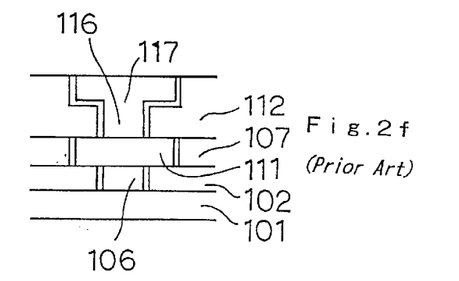

Thereafter, the entire assembly is polished by CMP to remove conductive layer 115 and barrier layer 114 except groove 113, thus producing via 116 and interconnection 117, as shown in FIG. 2f.

The above successive steps of the process produce a semiconductor device having a dual damascene structure. If a semiconductor device comprising a plurality of layers is to be fabricated according to the dual damascene technology, then the above process as shown in FIGS. 2b through 2f is repeated to produce a semiconductor device of dual damascene structure which comprises a plurality of layers.

A semiconductor device which comprises a plurality of layers includes a portion where interconnections and vias are formed linearly across several layers for heat radiation.

A semiconductor device which comprises a plurality of layers that has been fabricated according to the single damascene technology only will be described below with reference to FIG. 3 of the accompanying drawings.

Figure 3:
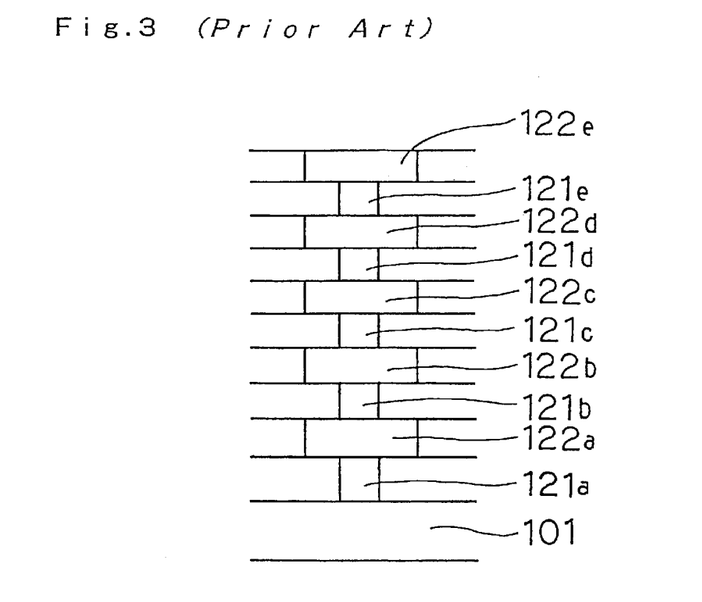
FIG. 3 is a fragmentary cross-sectional view of a semiconductor device which comprises a plurality of layers that has been fabricated according to the single damascene technology only.

As shown in FIG. 3, the semiconductor device comprises silicon substrate 101, contact 121a of tungsten and vias 121b–121e of tungsten, and interconnections 122a–122e of copper. Contact 121a, vias 121b–121e, and interconnections 122a–122e are deposited linearly on silicon substrate 101.

Tungsten has a relatively low heat conduction capability.

Therefore, the interconnection structure shown in FIG. 3 is liable to suffer thermal breakdown, thermal runaway, and latch-up, and has low ESD (Electrostatic Discharge) resistance.

A semiconductor device which comprises a plurality of layers that has been fabricated according to the dual damascene technology only will be described below with reference to FIG. 4 of the accompanying drawings.

Figure 4:
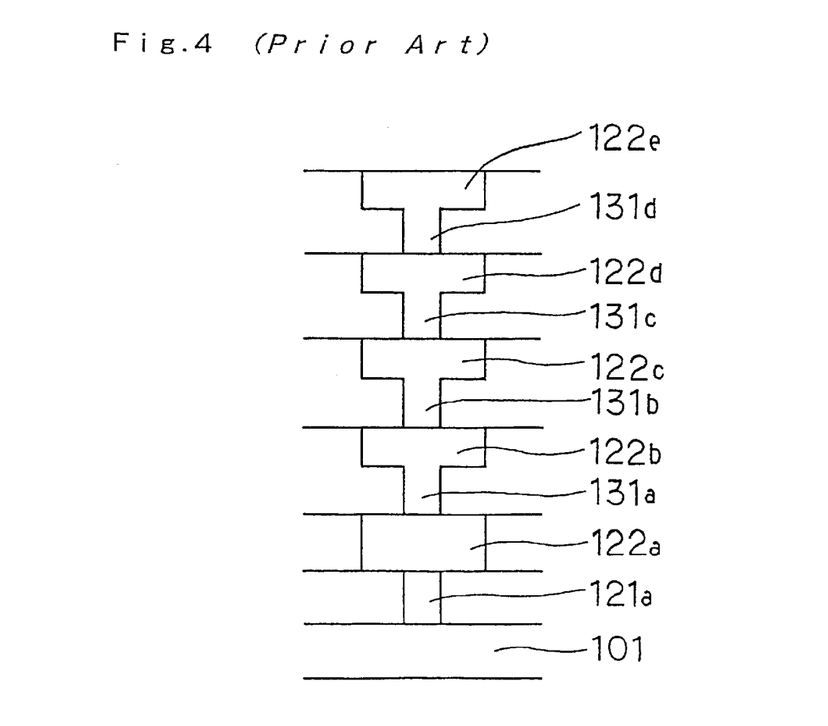
FIG. 4 is a fragmentary cross-sectional view of a semiconductor device which comprises a plurality of layers that has been fabricated according to the dual damascene technology only.

As shown in FIG. 4, the semiconductor device comprises silicon substrate 101, contact 121a of tungsten and vias 131a–131d of copper, and interconnections 122a–122e of copper. Contact 121a, vias 131a–131d, and interconnections 122a–122e are deposited linearly on silicon substrate 101.

Copper is of weak tensile strength and weak mechanical strength.

Therefore, when the semiconductor device with linearly arranged vias 131a–131d undergoes a bonding process, the region where vias 131a–131d are formed is apt to be broken under the bonding pressure.

SUMMARY OF THE INVENTION

It is therefore an object of the present invention to provide a semiconductor device which has large mechanical strength and excellent heat radiation capability, and a method of fabricating such a semiconductor device.

According to the present invention, a semiconductor device having a plurality of interconnection layers includes signal lines formed of copper according to a single damascene process, vias formed of tungsten beneath the signal lines according to a single damascene process, and power and ground lines and vias therebeneath formed of copper according to a dual damascene process. Since copper has a better heat conduction capability than tungsten, the semiconductor device has a better heat radiating capability than if the vias in all the layers were formed of tungsten.

The vias formed of copper beneath the power and ground lines have inside diameters greater than the inside diameters of the vias formed of tungsten beneath the signal lines by a predetermined proportion. The proportion is such that the mechanical strength of the vias formed beneath the power and ground lines is equal to or greater than the mechanical strength of the vias formed beneath the signal lines (specifically, greater by 12.9 times). Therefore, a reduction in the mechanical strength due to the vias being formed of copper is suppressed.

According to the present invention, furthermore, a semiconductor device having a plurality of at least six interconnection layers formed on a semiconductor substrate includes vias formed of tungsten in the first through third interconnection layers according to a single damascene process, interconnections formed of copper in the first through third interconnection layers according to a single damascene process, and vias and interconnections formed of copper in the interconnection layers higher than the third interconnection layer according to a dual damascene process. Since copper has a better heat conduction capability than tungsten, the semiconductor device has a better heat radiating capability than if the vias in all the layers were formed of tungsten.

The vias formed of copper in the interconnection layers higher than the third interconnection layer have inside diameters greater than the inside diameters of the vias formed of tungsten in the first through third interconnection layers by a predetermined proportion. The proportion is such that the mechanical strength of the vias in the interconnection layers higher than the third interconnection layer is equal to or greater than the mechanical strength of the vias in the first through third interconnection layers (specifically, greater by 12.9 times). Therefore, a reduction in the mechanical strength due to the vias being formed of copper is suppressed.

The above proportion determines not only the inside diameters of the vias formed of copper, but the number of vias in a location for interconnecting interconnection layers if the inside diameters of all the vias are equal to each other.

The above and other objects, features, and advantages of the present invention will become apparent from the following description with reference to the accompanying drawings which illustrate examples of the present invention.

BRIEF DESCRIPTION OF THE DRAWINGS

FIGS. 10a to 10k are fragmentary cross-sectional views illustrative of steps of forming a first layer in a process of fabricating the semiconductor device shown in FIGS. 5a and 5b;

DETAILED DESCRIPTION OF THE PREFERRED EMBODIMENTS

Figure 5A:
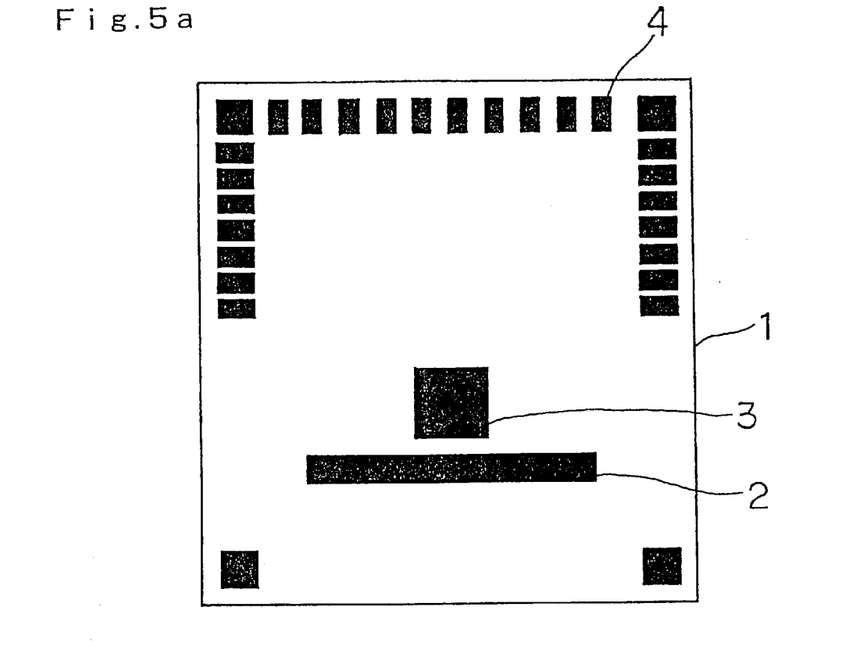
FIG. 5a is a plan view of a semiconductor device according to the present invention.
Figure 5B:
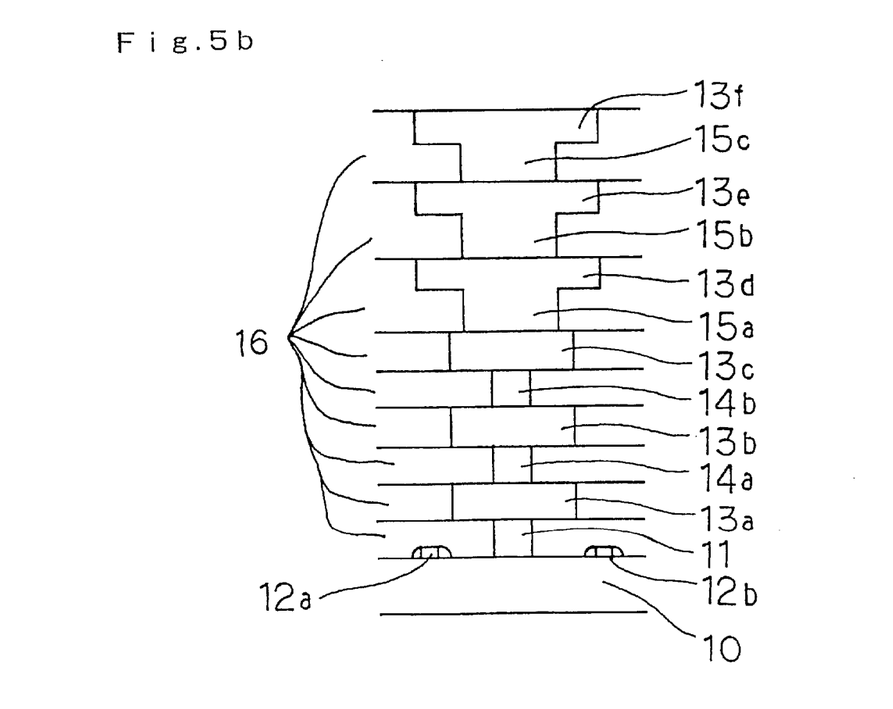
FIG. 5b is a fragmentary cross-sectional view of a portion of the semiconductor device shown in FIG. 5a which as an input/output buffer.

FIG. 5a shows in plan a semiconductor device according to the present invention. As shown in FIG. 5a, the semiconductor device has substrate 1 supporting thereon memory cells 2, clock driver 3, and input/output buffers 4 disposed in peripheral portions of substrate 1. As shown in FIG. 5b, each of the portions of substrate 1 which has one of input/output buffers 4 includes a plurality of vias arranged linearly across a plurality of layers.

Substrate 1 comprises silicon substrate 10, contact 11 of tungsten, interconnection 13a as a signal line of copper connected by contact 11 to transistors 12a, 12b formed on silicon substrate 10, via 14a of tungsten formed on interconnection, 13a, interconnection 13b as a signal line of copper connected to interconnection 13a by via 14a, via 14b of tungsten formed on interconnection 13b, interconnection 13c as a signal line of copper connected to the interconnection 13b by via 14b, via 15a of copper formed on interconnection 13c, interconnection 13d as a power line or ground line of copper connected to interconnection 13c by via 15a, via 15b of copper formed on interconnection 13d, interconnection 13e as a power line or ground line of copper connected to interconnection 13d by via 15b, via 15c of copper formed on interconnection 13e, and interconnection 13f as a power line or ground line of copper connected to interconnection 13e by via 15c. Contact 11 and interconnection 13a jointly make up a first layer. Via 14a and interconnection 13b jointly make up a second layer. Via 14b and interconnection 13c jointly make up a third layer. Via 15a and interconnection 13d jointly make up a fourth layer. Via 15b and interconnection 13e jointly make up a fifth layer. Via 15c and interconnection 13f jointly make up a sixth layer. Insulating films 16 are formed in the first layer to the sixth layer each. The first through third layers are of a single damascene structure, and the fourth through sixth layers of a dual damascene structure.

The relationship between the diameters and numbers of contact 11, vias 14a, 14b, and vias 15a through 15c will be described below.

Copper has a greater coefficient of thermal expansion than tungsten, and tungsten has a greater Young's modulus than copper. Based on these two characteristics, the mechanical strengths of tungsten and copper depending on the temperature are determined.

Figure 6:
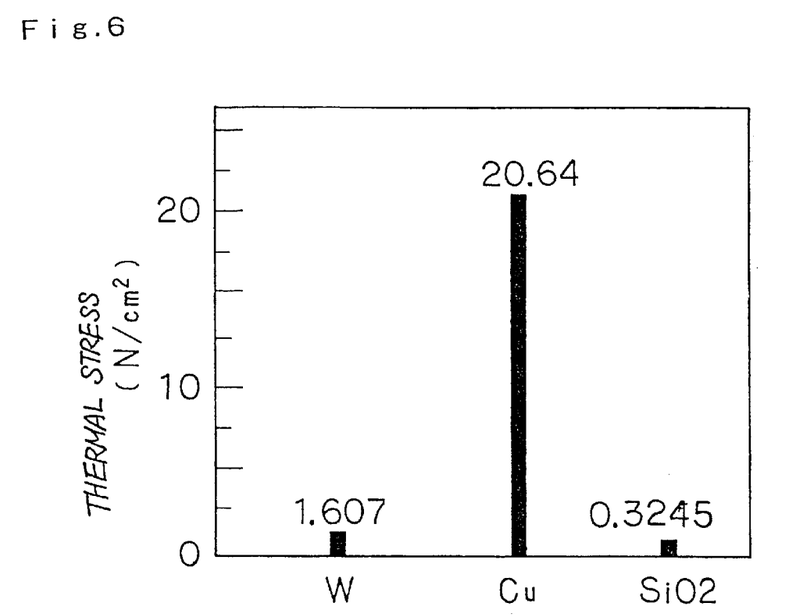
FIG. 6 is a graph showing the mechanical strengths of various materials depending on the temperature.

As shown in FIG. 6, tungsten has a thermal stress of 1.607 N/cm2 while copper has a thermal stress of 20.64 N/cm2. Therefore, in order to achieve a strength equal to or greater than the strength of tungsten with copper, it is necessary that the size of copper be at least 12.9 times greater than the size of tungsten.

Figure 7:
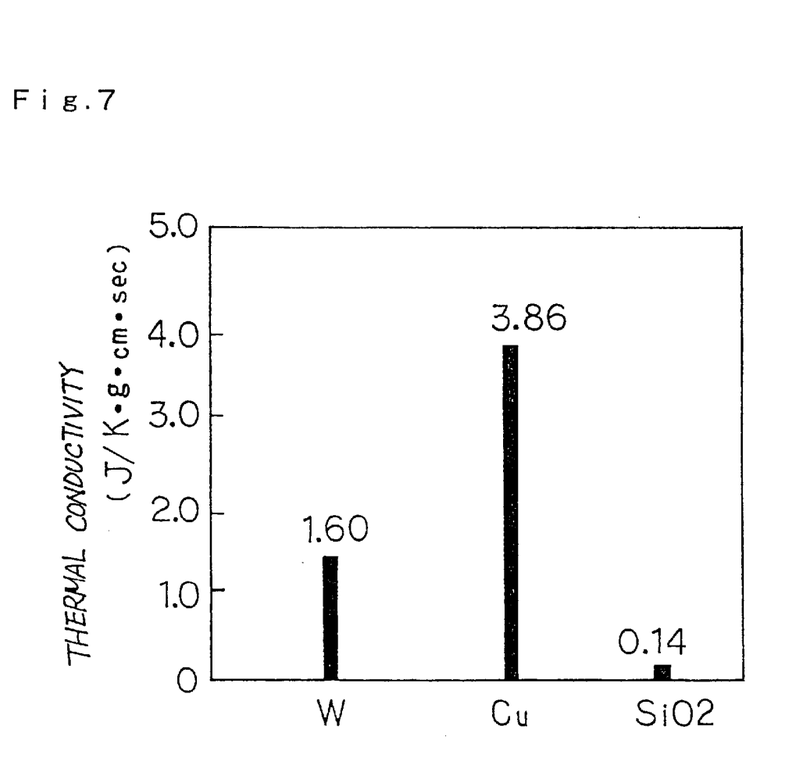
FIG. 7 is a graph showing the thermal conductivities of the materials.

As shown in FIG. 7, tungsten has a thermal conductivity of 1.60 J/K·g·cm·sec. while copper has a thermal conductivity of 3.86 J/K·g·cm·sec. Therefore, if the size of copper is at least 0.42 times greater than the size of tungsten, then it is possible to provide a sufficient heat radiating capability.

Based on the thermal stresses shown in FIG. 6 and the thermal conductivities shown in FIG. 7, if the area of vias 15a–15c of copper shown in FIG. 5b is 12.9 times greater than the area of contact 11 and vias 14a, 14b of tungsten, then the mechanical strength of vias 15a–15c can be made equivalent to the mechanical strength of vias 14a, 14b, and a sufficient heat radiating capability can be provided.

Figure 8:
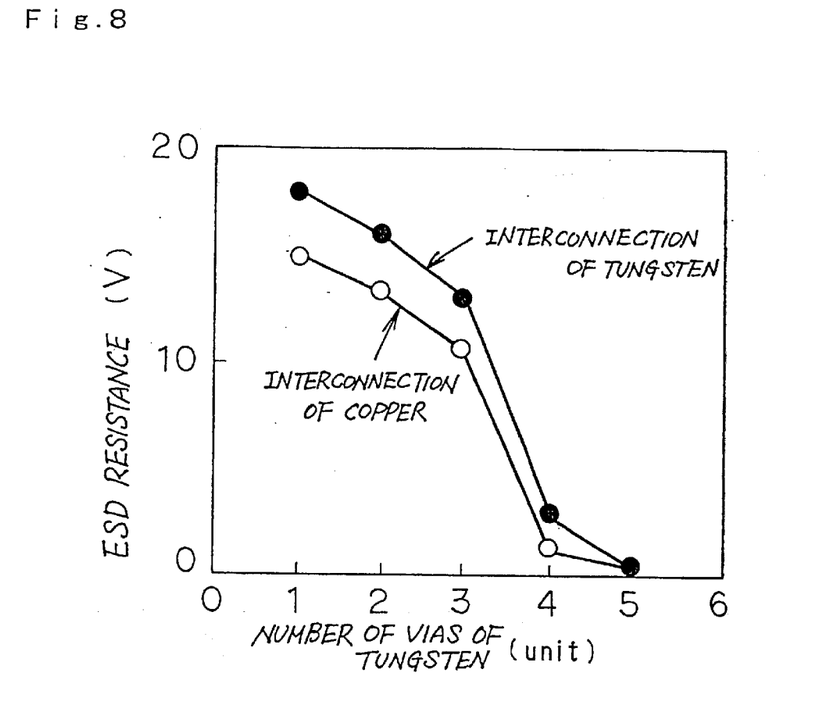
FIG. 8 is a graph showing the ESD resistance of the semiconductor device shown in FIGS. 5a and 5b depending on the number of vias of tungsten.

FIG. 8 shows the ESD resistance of the semiconductor device shown in FIGS. 5a and 5b depending on the number of vias of tungsten.

Generally, the ESD resistance of semiconductor devices is sufficient if it is 10 V, which is twice the power supply voltage of 5 V, or higher.

As shown in FIG. 8, the ESD resistance is sufficient if the number of vias of tungsten is 3 or less.

Figure 9:
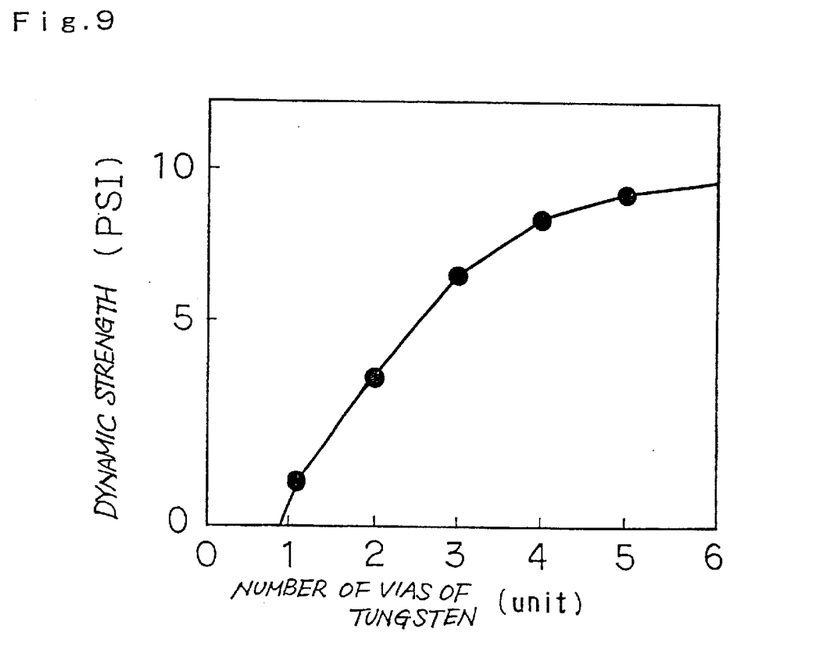
FIG. 9 is a graph showing the dynamic strength of the semiconductor device shown in FIGS. 5a and 5b depending on the number of vias of tungsten.

FIG. 9 shows the dynamic strength of the semiconductor device shown in FIGS. 5a and 5b depending on the number of vias of tungsten.

If the number of vias of tungsten is 3 or less based on the ESD resistance shown in FIG. 8, then the dynamic strength of the semiconductor device is about 7 PSI as shown in FIG. 9, which is of a sufficient level.

A process of fabricating the semiconductor device shown in FIGS. 5a and 5b will be described below with reference to FIGS. 10a through 10k, FIGS. 11a through 11l, and FIGS. 12a through 12i.

Figure 10A:
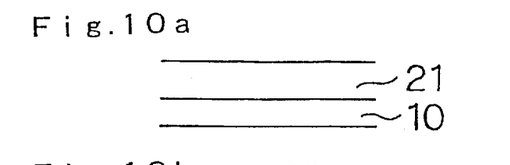

As shown in FIG. 10a, oxide film 21 is formed on silicon substrate 10.

Figure 10B:
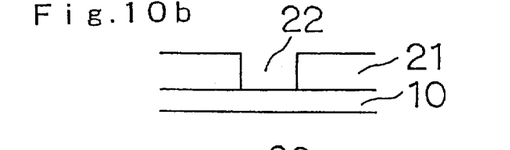

Then, as shown in FIG. 10b, groove 22 is formed by etching in a portion of oxide film 21 where a contact will be produced.

Figure 10C:
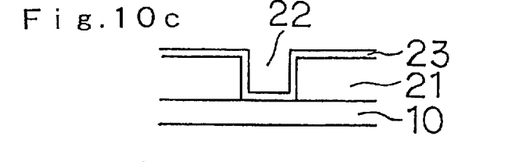
Figure 10D:
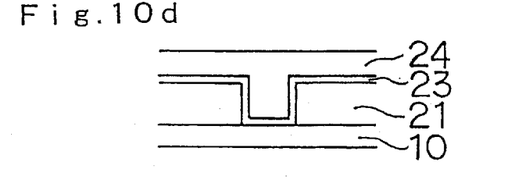

As shown in FIG. 10c barrier layer 23 of SiON is deposited on the entire surface of oxide film 21 including groove 22.

As shown in FIG. 1d, conductive layer 24 of tungsten is deposited on barrier layer 23, thereby embedding tungsten in groove 22.

Figure 10E:
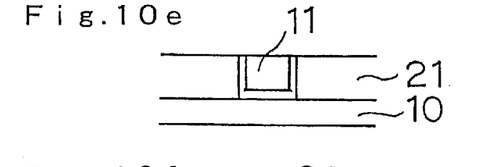

Thereafter, the entire assembly is polished by CMP (Chemical Mechanical Polishing) to remove conductive layer 24 and barrier layer 23 except groove 22, thus producing contact 11 in groove 22, as shown in FIG. 10e.

Figure 10F:
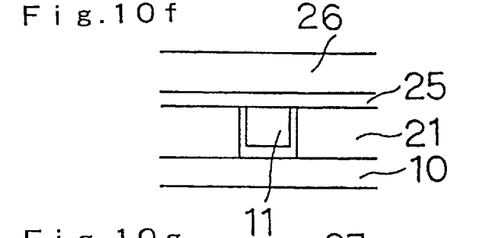

As shown in FIG. 10f, interlayer film 25 of SiON and oxide film 26 are successively formed on oxide film 21 with contact 11 formed therein.

Figure 10G:
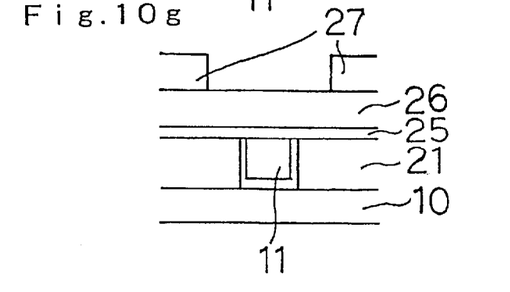

Then, as shown in FIG. 10g, resist 27 is coated on the surface of oxide film 26 except for a region where an interconnection will be formed.

Figure 10H:
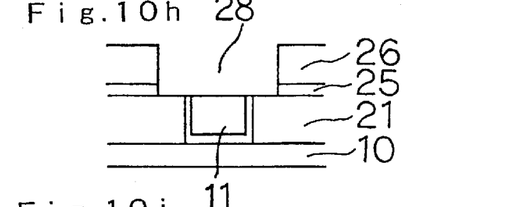

As shown in FIG. 10h, interlayer film 25 and oxide film 26 in the region where no resist 27 is coated are etched away, forming groove 28. Thereafter, resist 27 is removed.

Figure 10I:
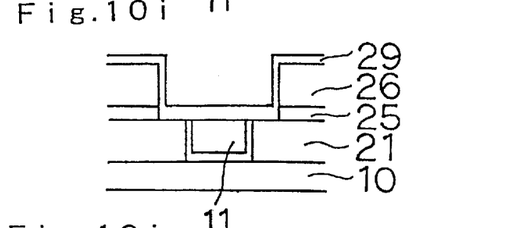

As shown in FIG. 10i, barrier layer 29 is deposited on the entire surface of oxide film 26 including groove 28.

Then, as shown in FIG. 10j, conductive layer 30 of copper is deposited on barrier layer 29, thereby embedding copper in groove 28.

Figure 10K:
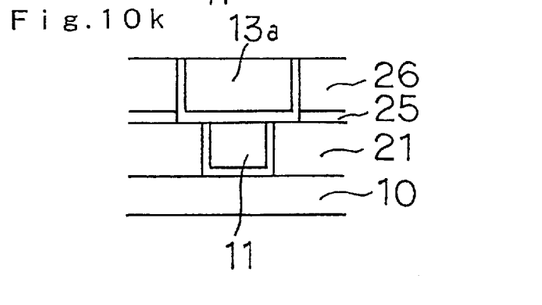

Thereafter, the entire assembly is polished by CMP to remove conductive layer 30 and barrier layer 29 except groove 28, thus producing interconnection 13a in groove 28, as shown in FIG. 10k.

A first layer is thus formed by the above steps.

Figure 11A:
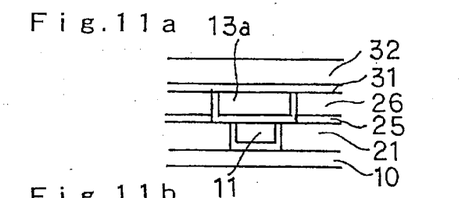
FIGS. 11a to 11l are fragmentary cross-sectional views illustrative of steps of forming second and third layers in the process of fabricating the semiconductor device shown in FIGS. 5a and 5b.

Then, as shown in FIG. 11a, an interlayer film 31 and an oxide film 32 are successively formed on the assembly thus formed by the steps shown in FIGS. 10a through 10k.

Figure 11B:
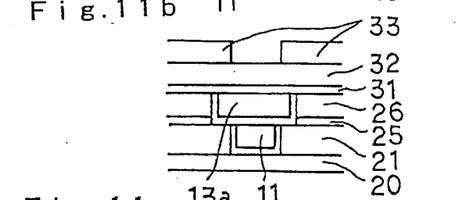

As shown in FIG. 11b, resist 33 is coated on the surface of oxide film 32 except for a region where a via will be formed.

Figure 11C:
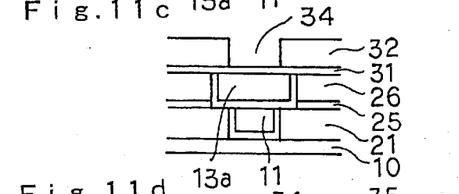

As shown in FIG. 11c, interlayer film 32 in the region where no resist 33 is coated is etched away, forming groove 34. Thereafter, resist 33 is removed.

Figure 11D:
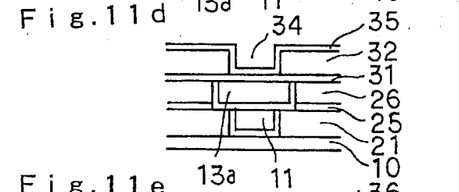

As shown in FIG. 11d, barrier layer 35 is deposited on the entire surface of oxide film 32 including groove 34.

Figures 11E, 11F:
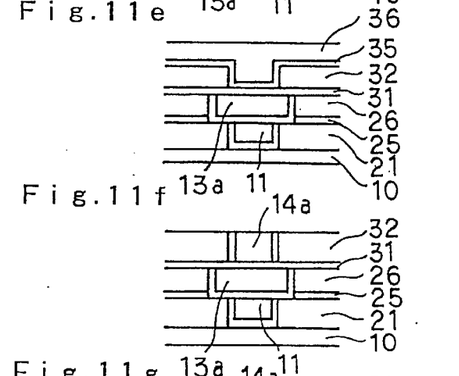

Then, as shown in FIG. 11e, conductive layer 36 of tungsten is deposited on barrier layer 35, thereby embedding tungsten in groove 34.

Thereafter, the entire assembly is polished by CMP to remove conductive layer 36 and barrier layer 35 except groove 34, thus producing via 14a in groove 34, as shown in FIG. 11f.

Figure 11G:
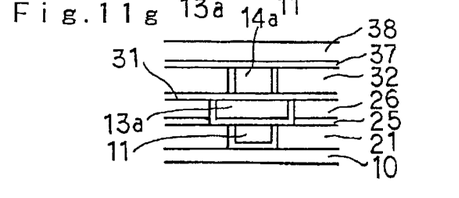

As shown in FIG. 11g, interlayer film 37 and oxide film 38 are successively formed on oxide film 32 with via 14a formed therein.

Figure 11H:
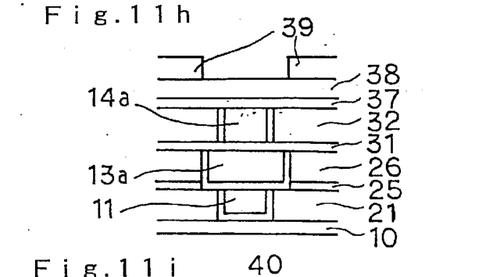

Then, as shown in FIG. 11h, resist 39 is coated on the surface of oxide film 37 except for a region where an interconnection will be formed.

Figures 11I, 11J:
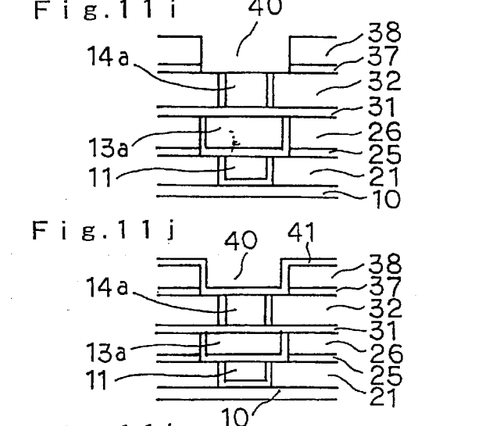

As shown in FIG. 11i, interlayer film 37 and oxide film 38 in the region where no resist 39 is coated are etched away, forming groove 40. Thereafter, resist 39 is removed.

As shown in FIG. 11j, barrier layer 41 is deposited on the entire surface of oxide film 39 including groove 40.

Figures 11K, 11L:
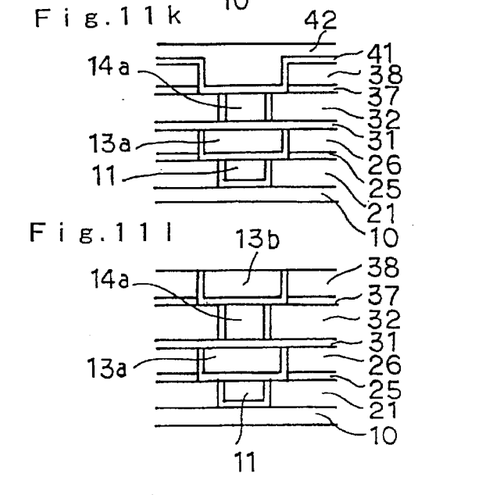

Then, as shown in FIG. 11k, conductive layer 42 of copper is deposited on barrier layer 41, thereby embedding copper in groove 40.

Thereafter, the entire assembly is polished by CMP to remove conductive layer 42 and barrier layer 41 except groove 40, thus producing interconnection 13b in groove 40, as shown in FIG. 11l.

A second layer is thus formed by the above steps.

The steps shown in FIGS. 11a through 11l are carried out again to form a third layer.

Figure 12A:
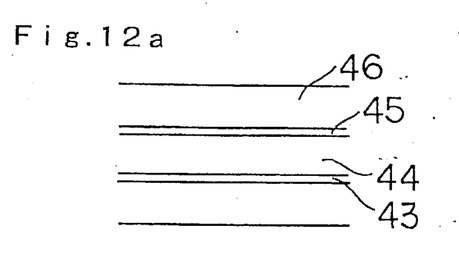
FIGS. 12a to 12i are fragmentary cross-sectional views illustrative of steps of forming fourth through sixth layers in the process of fabricating the semiconductor device shown in FIGS. 5a and 5b.

Then, as shown in FIG. 12a, interlayer film 43, oxide film 44, interlayer film 45, and oxide-film 46 are successively formed on the third layer which has been formed by the steps shown in FIGS. 11a through 11l.

Figure 12B:
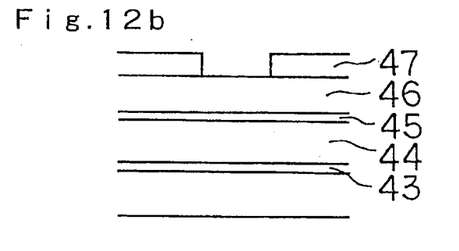

Then, as shown in FIG. 12b, resist 47 is coated on the surface of oxide film 46 except for a region where a via will be formed.

Figure 12C:
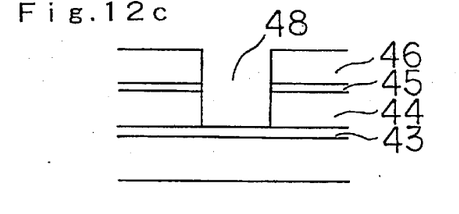

As shown in FIG. 12c, oxide films 44, 46 and interlayer film 45 in the region where no resist 47 is coated are etched away, forming groove 48. Thereafter, resist 47 is removed.

Figure 12D:
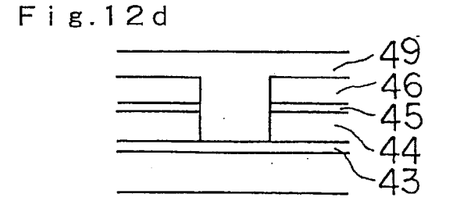

Then, as shown in FIG. 12d, antireflection film 49 is deposited on the entire surface of oxide film 46 including groove 48, thus embedding antireflection film 49 in groove 48.

Figure 12E:
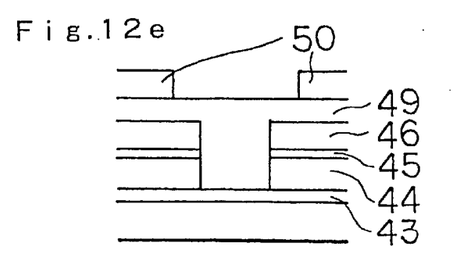

As shown in FIG. 12e, a resist 50 is coated on the surface of antireflection film 49 except for a region where an interconnection will be formed.

Figure 12F:
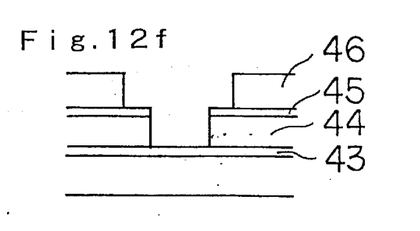

As shown in FIG. 12f, oxide film 46 and antireflection film 49 in the region where no resist 50 is coated are etched away. Thereafter, resist 50 is removed.

Figure 12G:
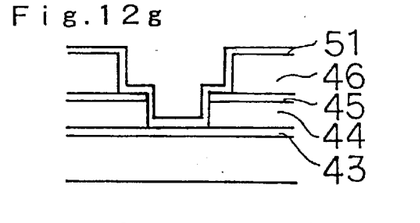

As shown in FIG. 12g, barrier layer 51 is deposited on the entire surface of assembly.

Figure 12H:
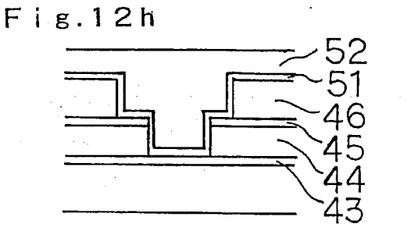

Then, as shown in FIG. 12h, conductive layer 52 of copper is deposited on barrier layer 51, thereby embedding copper in groove 48.

Figure 12I:
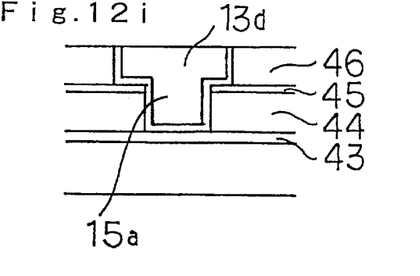

Thereafter, the entire assembly is polished by CMP to remove conductive layer 52 and barrier layer 51 except groove 48, thus producing via 15a and interconnection 13d in groove 48, as shown in FIG. 12i.

A fourth layer is thus formed by the above steps.

The steps shown in FIGS. 12a through 12i are repeated form fourth and fifth layers.

Figure 13:
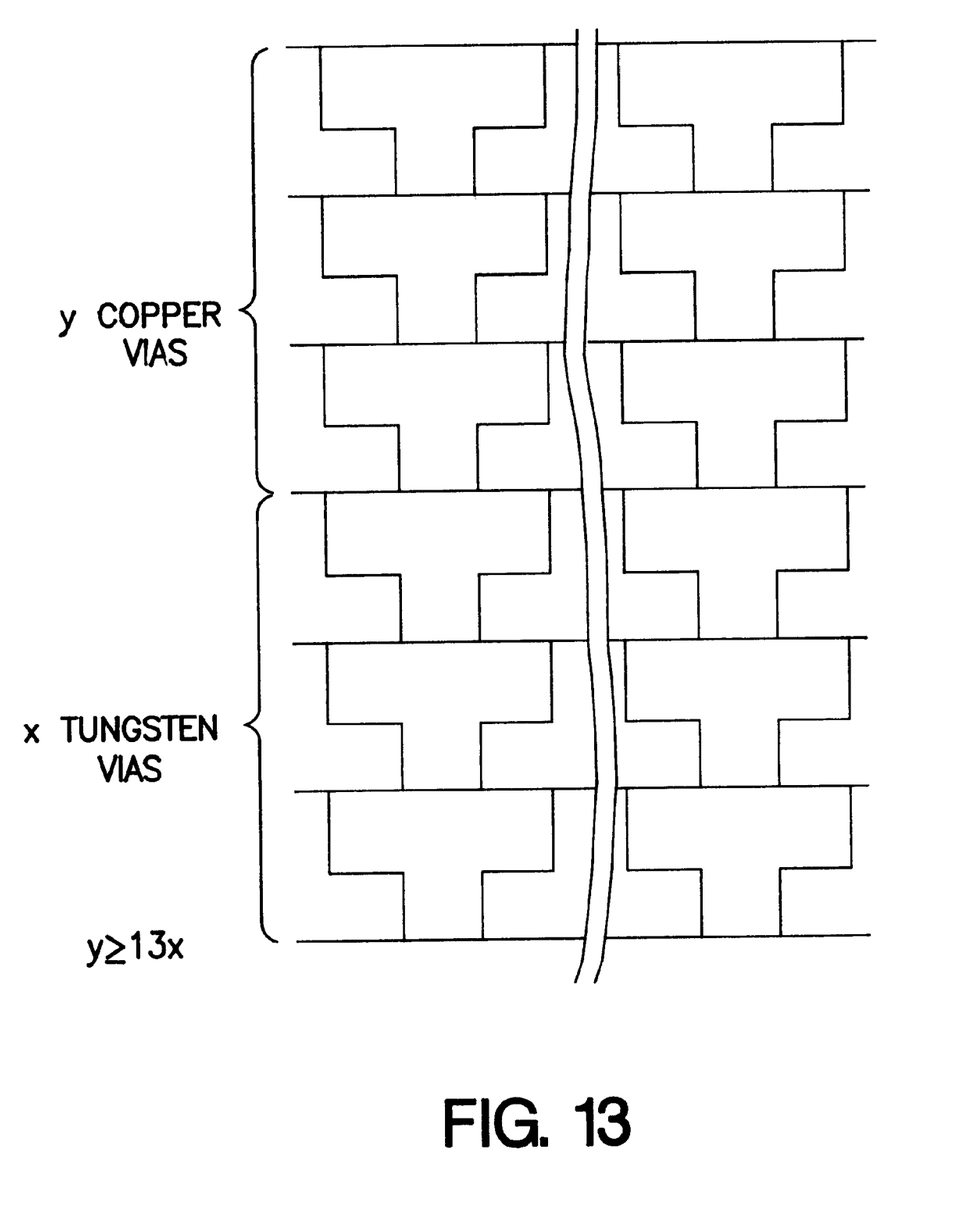
FIG. 13 is a schematic illustration of an embodiment in which copper vias outnumber tungsten vias by at least a factor of 13.

In the above embodiment, the area of vias 15a–15c of copper shown is 12.9 times greater than the area of contact 11 and vias 14a, 14b of tungsten. According to another embodiment, the areas of respective vias are equal to each other, and the number of vias of copper is 13 times greater than the number of vias of tungsten, as illustrated schematically in FIG. 13.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
   a semiconductor substrate with a plurality of components formed therein;
   a plurality of interconnection layers formed on said semiconductor substrate as signal lines of copper interconnecting said components and power and ground lines of copper for supplying electric energy to said components; and
   a plurality of vias formed beneath said signal lines and said power and ground lines and interconnecting said signal lines and said power and ground lines between said interconnection layers;
   said signal lines and said vias formed beneath said signal lines being formed according to a single damascene process, said vias being formed of tungsten;
   said power and ground lines and said vias formed beneath said power and ground lines being formed according to a dual damascene process, said vias formed beneath said power and ground lines in a location for connecting the power and ground lines to another interconnection layer having an area greater than the area of the vias formed beneath said signal lines in a location for connecting the signal lines to another interconnection layer by a predetermined proportion.

2. A semiconductor device according to claim 1, wherein the area of said vias formed beneath said power and ground lines in the location for connecting the power and ground lines to the other interconnection layer is 12.9 times greater than the area of the vias formed beneath said signal lines in the location for connecting the signal lines to the other interconnection layer.

3. A semiconductor device comprising:
   a semiconductor substrate with a plurality of components formed therein;
   a plurality of interconnection layers formed on said semiconductor substrate as signal lines of copper interconnecting said components and power and ground lines of copper for supplying electric energy to said components, the power lines being connected to a source of electrical power, the ground lines being connected to an electrical ground; and
   a plurality of vias formed beneath said signal lines and said power and ground lines and interconnecting said signal lines and said power and ground lines between said interconnection layers, all of said vias in the semiconductor device having respective inside diameters equal to each other;
   all of said signal lines and said vias formed beneath said signal lines being formed according to a single damascene process, said vias being formed of tungsten;
   all of said power and ground lines and said vias formed beneath said power and ground lines being formed according to a dual damascene process, wherein a total number of vias formed beneath said power and ground lines in the semiconductor device for connecting the power and ground lines to another interconnection layer is greater than a total number of vias formed beneath said signal lines in the semiconductor device for connecting the signal lines to another interconnection layer by a factor of at least 13.

4. A semiconductor device comprising:
   a semiconductor substrate with a plurality of components formed therein;
   a plurality of at least six interconnection layers formed of copper on said semiconductor substrate and interconnecting said components, said interconnection layers having interconnections; and
   a plurality of vias formed in said interconnection layers and interconnecting said interconnection layers;
   the interconnections and the vias in the first through third interconnection layers being formed according to a single damascene process, said vias being formed of tungsten;
   the interconnections and the vias in the interconnection layers higher than said third interconnection layer being formed according to a dual damascene process, said vias in the interconnection layers higher than said third interconnection layer in a location for connecting to another interconnection having an area greater than the area of the vias in the first through third interconnection layers in a location for connecting to another interconnection layer by a predetermined proportion.

5. A semiconductor device according to claim 4, wherein the area of the vias in the interconnection layers higher than said third interconnection layer in the location for connecting to the other interconnection layer is at least 12.9 times greater than the area of the vias in the first through third interconnection layers in the location for connecting to the other interconnection layer.

6. A semiconductor device comprising:
- a semiconductor substrate with a plurality of components formed therein;
- a plurality of at least six interconnection layers formed of copper on said semiconductor substrate and interconnecting said components, said interconnection layers having interconnections; and
- a plurality of vias formed in said interconnection layers and interconnecting said interconnection layers, said vias having respective inside diameters equal to each other;
- all of the interconnections and the vias in a set of first through third consecutively arranged interconnection layers being formed according to a single damascene process, all of said vias within said first through third interconnection layers being formed of tungsten;
- all of the interconnections and the vias in a set of consecutively arranged said interconnection layers higher than said third interconnection layer being formed according to a dual damascene process, wherein the number of vias in said interconnection layers higher than said third interconnection layer in a location for connecting to another interconnection layer is greater than the number of vias in the first through third interconnection layers in a location for connecting to another interconnection layer by a predetermined proportion.

7. A semiconductor device according to claim 6, wherein a total number of vias in said interconnection layers higher than said third interconnection layer in the location for connecting to the other interconnection layer is at least 13 times greater than a total number of vias in the first through third interconnection layers in the location for connecting to the other interconnection layer.

* * * * *